United States Patent [19]

Tanaka et al.

[11] 4,199,696
[45] Apr. 22, 1980

[54] MULTIPLIER USING HALL ELEMENT

[75] Inventors: Shikei Tanaka, Chigasaki; Kunihiko Matsui; Tetsuji Kobayashi, both of Yokohama, all of Japan

[73] Assignee: Tokyo Shibaura Electric Co., Ltd., Kawasaki, Japan

[21] Appl. No.: 849,419

[22] Filed: Nov. 7, 1977

[30] Foreign Application Priority Data

Mar. 18, 1977 [JP] Japan ................................. 52-30090
Mar. 18, 1977 [JP] Japan ................................. 52-30091
Mar. 18, 1977 [JP] Japan ................................. 52-30094
Mar. 18, 1977 [JP] Japan ................................. 52-30095

[51] Int. Cl.² ........................................... H03K 17/90
[52] U.S. Cl. ................................ 307/309; 324/117 H; 323/94 H; 328/160
[58] Field of Search ....................... 307/309; 328/160; 324/117, 142, 251; 323/94 H

[56] References Cited

U.S. PATENT DOCUMENTS

| 3,099,792 | 7/1963 | Leger, Jr. | 324/251 |
| 3,121,788 | 2/1964 | Hilbinger | 307/309 |
| 3,317,835 | 5/1967 | Dietz et al. | 324/142 |
| 3,688,133 | 8/1972 | Flachsbarth | 307/309 |
| 3,718,861 | 2/1973 | Ramsey, Jr. | 324/142 |

Primary Examiner—Stanley D. Miller, Jr.
Assistant Examiner—B. P. Davies
Attorney, Agent, or Firm—Oblon, Fisher, Spivak, McClelland & Maier

[57] ABSTRACT

A multiplier using Hall element comprises a Hall element with a pair of control current input terminals and a pair of Hall output terminals, an electromagnet for converting load current into magnetic field and for applying the magnetic field to the Hall element, a transformer for converting load voltage into control current, and a constant current circuit for making the secondary current of the transformer constant and then feeding it to said control current input terminals. The Hall element produces across the pair of Hall output terminals Hall output voltage corresponding to the product of the load current and the load voltage.

10 Claims, 13 Drawing Figures

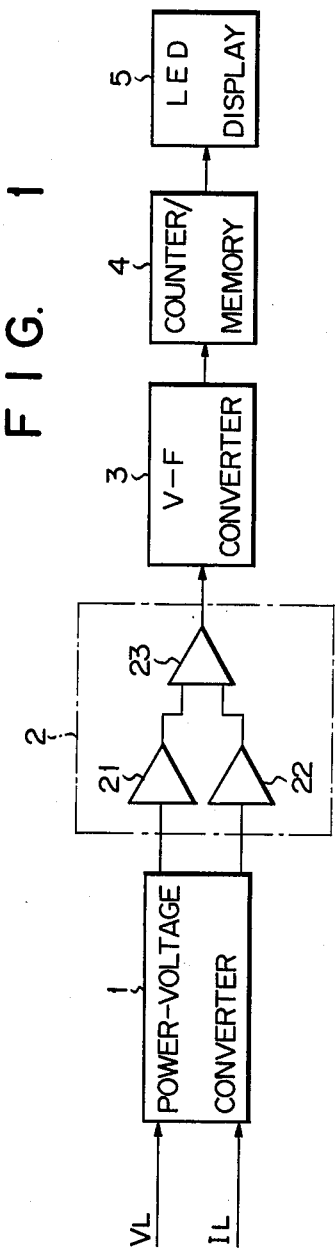
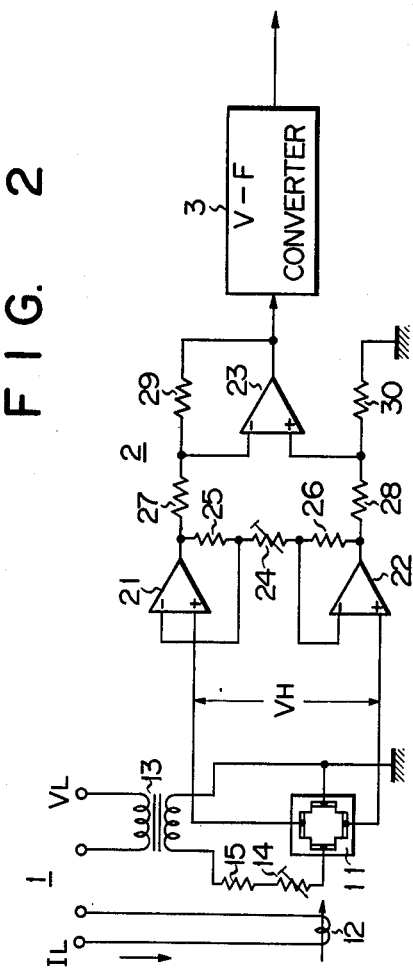

MULTIPLIER USING HALL ELEMENT

The invention relates to a multiplier for calculating the product of current and voltage by using a Hall element and more particularly to the one useful for watt-hour meters.

Watt-hour meters now commonly used are classified into DC type and AC type ones; induction watt-hour meters, mercury-motor watt-hour meters, and commutator watt-hour meters for DC type and induction watt-hour meters for AC type. In these type watt-hour meters, the product of current and voltage, i.e. measured power, is applied to a motor to develope a drive torque corresponding thereto to rotate the motor at the corresponding speed. The amount of the rotation of the motor is measured of power consumption. With such a construction, they suffer inherent problems such as demagnetization of an electromagnet for speed control, wear of the rotational parts such bearings, gears, and the like, possibly causing measurement error and poor reliability. Further, when it is applied to automatic meter inspection with attendant remote display of measurement values, they need complex signal converting apparatus. Further, now available watt-hour meters have the best precision of measurement at most up to 0.5%, followed by bulkiness of meters.

Accordingly, the primary object of the invention is a multiplier permitting realization of watt-hour meters which uses a Hall element as means to obtain the product of current and voltage, and maintains high reliability for long time use, with high precision but simple construction.

According to the invention, there is provided a multiplier comprising at least one Hall element with a pair of control current input terminals and a pair of Hall output voltage terminals, an electromagnet for converting load current into magnetic field and for applying the magnetic field to the Hall element, means for converting load voltage into control current and for feeding the control current to the control current input terminals. The Hall element produces Hall output voltage corresponding to the product of the load current and the load voltage across the pair of Hall output terminals.

The invention will be better understood from the following description taken in connection with the accompanying drawings, in which:

FIG. 1 shows a block diagram of a watt-hour meter constructed by using a multiplier using a Hall element according to the invention;

FIG. 2 shows a circuit diagram of an embodiment of the invention;

Figure 3:
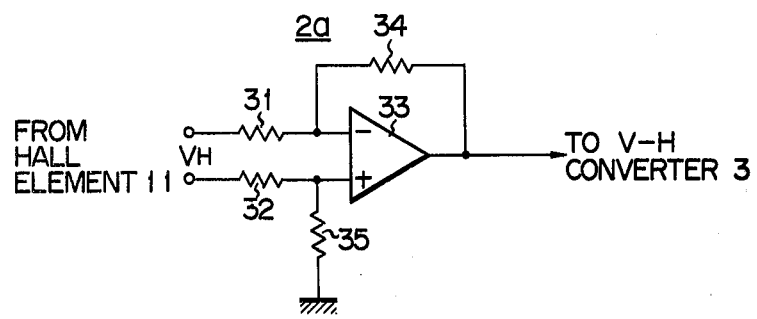
FIG. 3 is a circuit diagram of another differential amplifier circuit in FIG. 2.

Referring now to the drawings where like numerals designate identical or corresponding parts throughout the several views, the invention will be given about an embodiment that the invention is applied to a watt-hour meter. FIG. 1 shows a block diagram illustrating the entire of a watt-hour meter using a current/voltage multiplier according to the present invention. A load current $I_L$ and a load voltage $V_L$ are applied to a power-voltage converter of the multiplier. The power-voltage converter is designated by numeral 1. In the converter, the load current $I_L$ is converted into a bias magnetic field and the load voltage $V_L$ into a control current. These converted ones are applied into a Hall element which in turn produces a Hall output voltage $V_H$ proportional to the load power, i.e. $I_L \times V_L$. The output voltage $V_H$ is applied to a differential amplifier circuit 2 comprised of three operational amplifiers 21, 22 and 23 where the in-phase component thereof is removed, and amplified. The output voltage of the differential amplifier circuit 2 is fed to a voltage-frequency (V-F) converter 3 which produces pulses with the frequency corresponding to the output voltage of the amplifier circuit 2. The pulses obtained are fed to a counter memory 4 where they are counted and stored. The counted value is then displayed in a light emission diode (LED) 5. The displayed counted value indicates the consumed power, i.e. the product of the load current $I_L$ and the load voltage $V_L$. The counter memory 4 may be constructed by a non-volatile semi-conductor memory or a mechanical counter using a stepping motor or the like.

The power-voltage converter 1 in FIG. 1 corresponds to the multiplier using a Hall element of the invention. An embodiment of the multiplier is shown in FIG. 2. A control current supply circuit included in the power-voltage converter 1 is comprised of a coil 12 to be applied with a bias magnetic field corresponding to a single phase load current $I_L$ to a Hall element 11, a boosting transformer 13 for feeding a fixed current corresponding to the load voltage $V_L$ to the control current input terminals of the Hall element, a variable resistor 14 and a fixed resistor 15. The load voltage $V_L$ is applied to the primary winding of the transformer 13 and a high voltage current induced in the secondary winding thereof is processed by the combination of the variable resistor 14 and the fixed resistor 15 into a constant current to be directed to the control current input terminal of the Hall element 11.

As well known, the Hall element 11 is fabricated in such a manner, for example, that an epitaxial layer of GaAs is grown on a semi-insulating GaAs substrate and the layer is photo-etched to form a pair of control current input terminals and a pair of Hall voltage output terminals. A Hall element used as the Hall element 11 of the example has, for example, the internal resistance between Hall voltage output terminals 1200 ohms and the Hall output voltage $V_H$ of 22 mV/KG mA. The winding T of the electromagnet coil has 18 turns, for example. The coil is designated by numeral 12. The load current $I_L$ is fed to the coil 12 to develope a bias magnetic field which is in turn applied to the Hall element 11. The load voltage $V_L$ is boosted by the transformer 13 to high voltage of several hundreds volts which in turn is converted by the variable resistor 14 and the fixed resistor 15 into control current to be fed to the Hall element 11. The control current proportional to the load voltage $V_L$ flows into the Hall element 11. The internal resistance of the Hall element 11 as seen from the control current terminals is much smaller than resistances of the resistors 14 and 15. Therefore, if the internal resistance changes slightly due to the change of its atmospheric temperature and magnetic field, the rate of change of the resistance of the entire circuit connected to the secondary of the transformer 13 is very small, so that the control current is kept substantially constant. In this way, the combination of the transformer 13 and the resistors 14 and 15 serves as a constant current source.

In this manner, the bias magnetic field corresponding to the load current $I_L$ and the control current corresponding to the load voltage $V_L$ are applied to the Hall element 11, and the product of both, i.e. the power consumed amount of the load, is produced from the Hall element 11 in terms of the Hall output voltage $V_H$.

The Hall output voltage $V_H$ is applied to the differential amplifier having three operational amplifiers 21, 22 and 23 and with high input impedance. That is, since the input impedance of the non-inverted amplifier may be made extremely high, the pair of Hall voltage output terminals are connected to the non-inverted input terminals of the amplifiers 21 and 22, respectively. The output terminals of the operational amplifiers 21 and 22 are connected through resistors 27 and 28 to the inverted input terminals thereof, respectively, as shown in the figure. The output of the operational amplifier 21 is also connected through a resistor 27 to the inverted input of the operational amplifier 23. Likewise, the output of the operational amplifier 22 is connected through a resistor 28 to the non-inverted input of the operational amplifier 23. A variable resistor 24 is coupled between the resistors 25 and 26. The gain of the differential amplifier circuit 2 may be adjusted by changing the resistance of the variable resistor 24. The non-inverted input terminal of the operational amplifier 23 is earthed through a resistor 30. The output of the operational amplifier 23 is connected through a resistor 29 to the inverted input thereof and to the input terminal of the V-F converter 3. In this example, the resistor 24 (R1) is 10 kiloohms; the resistors 25 (R2) and 26 (R3) 10 kiloohms; the resistor 27 (R4) 3 kiloohms; the resistor 28 (R5) 3.5 kiloohms; the resistor 29 (R7) 10 kiloohms; and the resistor 30 (R6) 10 kiloohms. The couple of the operational amplifiers 21 and 22 removes the in-phase component of the Hall output voltage $V_H$ and the remaining operational amplifier 25 amplifies the in-phase removed voltage therefrom. Assume now that one of the control current terminals of the Hall element is placed at the reference potential (the ground potential), the potentials at the respective Hall output terminals are designated by characters $e_1$ and $e_2$, and the potentials at the output terminals of the non-inverted amplifiers 21 and 22 by $e_3$ and $e_4$. The potentials $e_3$ and $e_4$ are given by equations (1) and (2).

$$e_3 = (1 + \frac{R_2}{R_1}) e_1 - \frac{R_2}{R_1} e_2 \quad (1)$$

$$e_4 = (1 + \frac{R_3}{R_1}) e_2 - \frac{R_3}{R_1} e_1 \quad (2)$$

The difference voltage $e_0$ between the output voltages of the amplifiers 21 and 22 is given $$e_0 = e_3 - e_4 = (e_1 - e_2)(1 + \frac{R_2 + R_3}{R_1}) \quad (3)$$

In the equation (3), $(E_1 - e_2)$ represents the Hall output voltage $V_H$.

As seen from the equation (3), resistors 24, 25 and 26 ($R_1$, $R_2$ and $R_3$) are independent of the common mode rejection ratio (CMRR) of the differential amplifier circuit 2. In other words, the gain of the circuit may be adjusted by $(R_2 + R_3)/R_1$ without any influence on the CMRR of the circuit. The change of any of the resistors $R_1$ to $R_3$ is permitted independently of the potentials $e_1$ and $e_2$. This is implied by the equation (3).

By using the thus constructed differential amplifier circuit 2, the output of the Hall element may be varied by changing the variable resistor 24 without being accompanied by any deterioration of the CMRR. Accordingly, the resistor 24 may be used as a rating adjusting means of the watt-hour meter constructed as shown in FIG. 1. A fixed resistor may be of course be used in place of the variable resistor 24. Further, the CMRR of the circuit may be adjusted by changing the resistance of the resistor $R_4$ or $R_5$.

As described above, according to the example mentioned above, the power consumption of the load of single phase may be digitally measured with a high accuracy. The watt-hour meter using the example has no mechanical rotational parts unlike the convention one. Particularly, the control current fed from the constant current circuit comprising the transformer 13, high resistive resistors 14 and 15 is little influenced by ambient temperature and bias magnetic field variations. Accordingly, incooperation of the above-mentioned embodiment into the watt-hour meter provides durable and high reliable electronic type wattmeters. Additionally, such the watt-hour meter is suitable for application thereof to the automatic meter inspection (remote measurement).

As mentioned above, the embodiment of FIG. 2 uses the differential amplifier circuit 2 consisting of three operational amplifiers 21 to 23 to remove the in-phase component of the output voltage $V_H$ and amplifies it. The amplifier circuit 2 may be substituted by a differential amplifier circuit 2a as shown in FIG. 3.

In FIG. 3, the output terminals of the Hall element 11 are coupled with the inverted and non-inverted input terminals of an operational amplifier 33, through resistors 31 and 32. The resistances of the resistors 31 and 32 are set up to be equal to each other and much larger than that of the internal resistor of the Hall element 11. A resistor 34 is connected between the output terminal of the amplifier 33 and the inverted input terminal thereof. The non-inverted input terminal is earthed through a resistor 35 with resistance equal to that of the resistor 34. The use of such the amplifier may similarly amplifies the Hall output voltage $V_H$.

Figure 4:
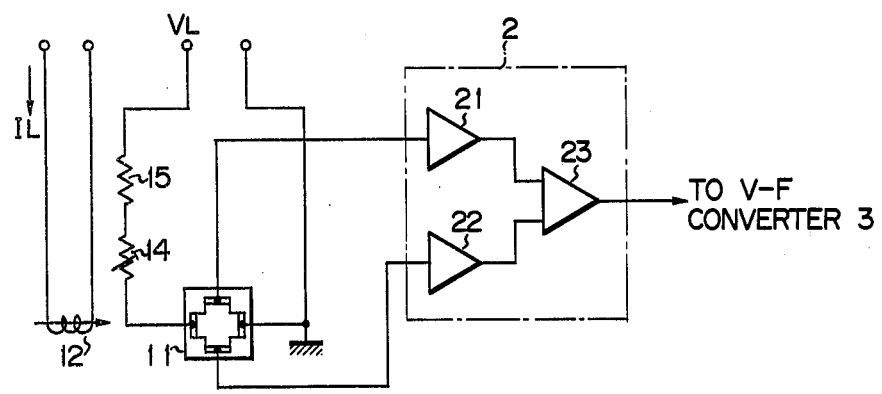
FIG. 4 is a circuit diagram of another embodiment of the invention.

The FIG. 2 embodiment uses the constant current circuit including the transformer 13, and high resistive resistors 14 and 15 to supply the constant control current corresponding to the load voltage $V_L$ to the Hall element 11. An alternation of this is shown in FIG. 4 in which the load voltage $V_L$ is directly applied to the Hall element 11 through resistors 14 and 15. This connection similarly provides a constant control current to the Hall element 11. The remaining circuit of FIG. 4 is the same as of the FIG. 2 circuit. The circuit of FIG. 2 is applied for only the single phase AC power measurement, but the circuit of FIG. 4 may measure the power consumption of DC.

Figure 5:
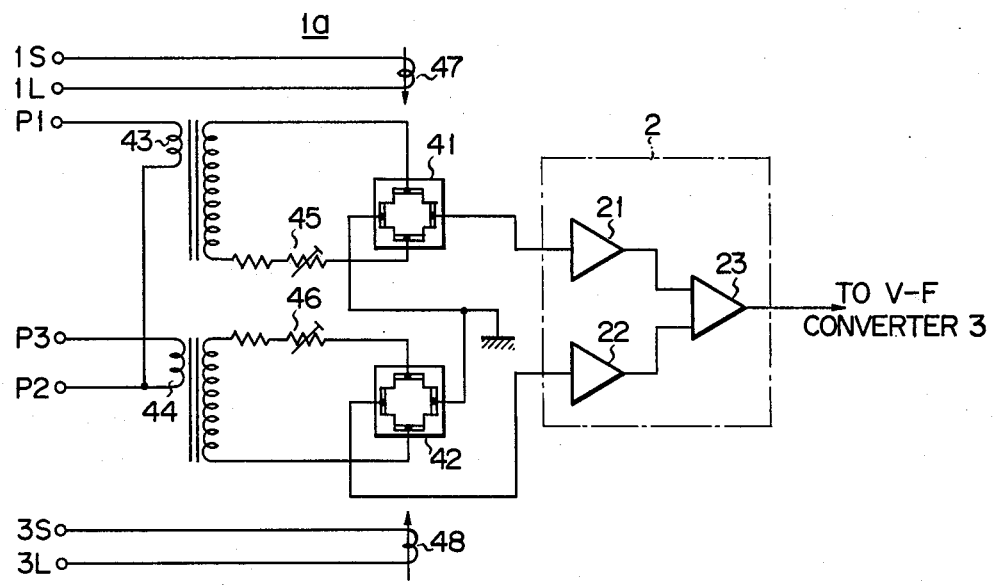
FIG. 5 is a circuit diagram when the invention is applied to a three-phase watt-hour meter.

A multiphase (N-phase) watt-hour meter for measuring the power consumption of N-phase AC power is constructed by using (N−1) Hall elements in the power-voltage converter and connecting in series the outputs of the respective Hall elements. FIG. 5 shows an example of the power-voltage converter 1a for measuring three-phase power of AC. In this circuit for three-phase measurement, N=3 so that number of Hall elements is 3−1, i.e. 2. That is, two Hall elements 41 and 42 are used as shown. One of the control input terminals of the Hall element 41 is connected through a high resistive resistor 45 to the secondary side of the transformer 43. Similarly, one of the input terminals of the Hall element 42 is connected through a high resistive resistor 46 to the secondary side of a transformer 44. One of the primary coil of the transformer 43 is connected to a $P_1$ phase of the three phase load, and the other terminal thereof to a $P_2$ phase. One of the terminals of the primary of the transformer 44 is connected to a $P_3$ phase and the other terminal to a $P_2$ phase. The interphase voltage between the phases $P_1$ and $P_2$ is boosted by the transformer 43 to several hundreds volts, for example. The boosted voltage is converted through the variable resistor 45 into a constant current to be directed to the control current input terminals of the Hall element 41. The interphase voltage between the phases $P_2$ and $P_3$ is boosted by the transformer 44 to several hundreds volts which in turn is applied through the variable resistor 46 to the control current input terminals of the Hall element 42. The control current to be fed to the Hall element 42 is made constant by the variable resistor 46.

A load current is applied through a load side terminal 1L and a power source side terminal 1S to an electromagnet coil 7. Another load current phases through a power source side terminal 3S and a load side terminal 3L to another electromagnet coil 48. The magnetic fields developed therein are applied as bias magnetic fields to the Hall elements 41 and 42, respectively. One of the output terminals of the Hall element 41 is coupled with the input terminal of the non-inverted amplifier 21. The other input terminal thereof is earthed together with one of the output terminals of the Hall element 42. The other output terminal of the Hall element 42 is connected to the input terminal of the non-inverted amplifier 22. That is, the output voltages of the Hall elements 41 and 42 are coupled in series and the resultant voltage is applied to the differential amplifier circuit 2, as in the case of FIG. 2. Upon receipt of the resultant voltage, th differential amplifier circuit 2 produces an output voltage corresponding to the three phase power to be measured and with none of the in-phase component.

It is preferable that two Hall elements 41 and 42 in the FIG. 3 embodiment are of a type that the misalignment voltages of the elements are offset each other. Use of such a type Hall elements improves the accuracy of measurement in a light load current region.

Figure 6:
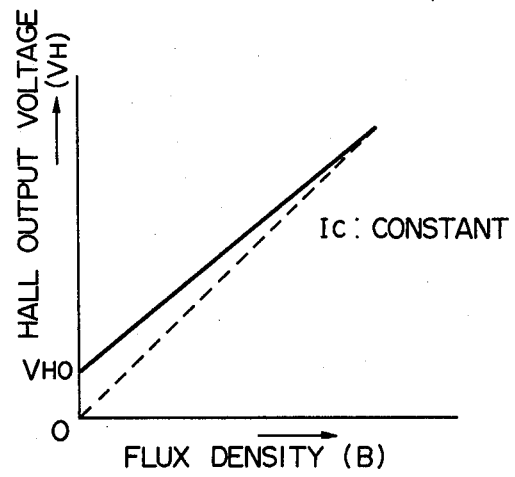
FIG. 6 is a graph for illustrating the relation between the flux density of the bias magnetic field of a common type Hall element and the Hall output voltage thereof.

The explanation to follow is elaboration of the offset operation of the misalignment voltages of the two elements. FIG. 6 shows a general relation of the Hall output voltage ($V_H$) of a single Hall element well known versus the flux density of the bias magnetic field. The control current (Ic) is kept constant. Ideally, the Hall output voltage $V_H$ must be zero when the flux density is zero, as indicated by a dotted line in the figure. In actuality, however, a Hall output voltage $V_{HO}$ (although it is small) appears even if the flux density of the bias magnetic field is zero, as indicated by a continuous line. The voltage $V_{HO}$ is called the misalignment voltage. If a single Hall element is used to construct a watt-hour meter with the control current proportional to the load voltage to be measured the flux density proportional to the load current, the misalignment voltage $V_{HO}$ still exists and thus the Hall output voltage, i.e. the power value, is not zero, even when the flux density is zero. This results in a measurement error. Error takes place in the vicinity of zero of the load current.

Figure 7:
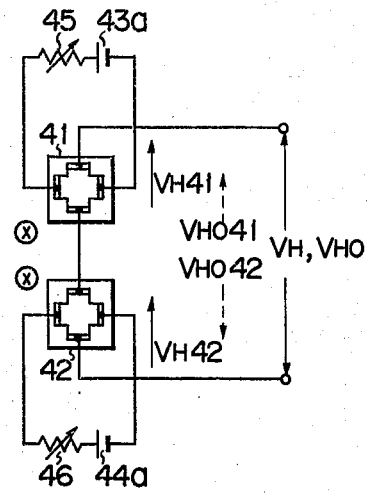
FIGS. 7 and 8 are diagrams for illustrating the way to remove the misalignment voltage by connecting in series two Hall elements.

For this reason, when two Hall elements are placed in a magnetic field and their voltages exhibit inverse polarity, these are connected in series as shown in FIG. 7, with a disposition as they stand. On the other hand, when they exhibit the same polarity, the direction of one of the Hall elements is reversed and then they are connected in series of the outputs thereof, as shown in FIG. 8.

In the embodiment shown in FIG. 7, two Hall elements 41 and 42 are disposed in a magnetic field with unidirection; DC power sources 43a and 44a feed control currents in the same direction through variable resistors 45 and 46 to the Hall elements 41 and 42, respectively. In this case, the misalignment voltages of the respective Hall elements are inverse in polarity so that the resultant misalignment voltage of the two Hall elements is the sum of the misalignment voltages $V_{HO41}$ and $V_{HO42}$. Therefore, these are substantially cancelled each other so that the resultant misalignment voltage $V_{HO}$ becomes extremely small. The misalignment voltage $V_{HO41}$ and $V_{HO42}$ of each Hall element depends on the control current. Therefor, the amount of the control current fed to each element may be finely adjusted by the corresponding variable resistor 45 or 46. As a result, the misalignment voltage $V_{HO}$ may be adjusted zero. As shown in FIG. 7, the same directional control currents in a magnetic field are fed to two Hall elements 41 and 42. Therefore, the Hall output voltages $V_{H41}$ and $V_{H42}$ have the same direction. The output voltage of the coupled Hall elements is the sum of these and thus the resultant voltage thereof is substantially two times the output voltage of a single one. With the circuit construction shown in FIG. 7, the output voltage is made doubled compared to that of the single Hall element and the resultant misalignment voltage is substantially zero.

Figure 8:
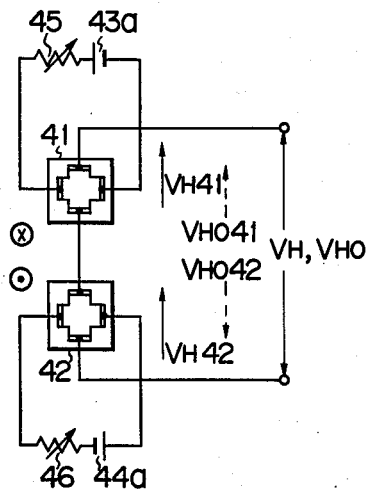

In case two Hall elements have the same polarity of the misalignment voltages, the circuit arrangement shown in FIG. 8 is used. As shown, two Hall elements 41 and 42 are disposed in the bias magnetic fields with opposite polarities. That is, the Hall element 41 is placed in the magnetic field with the direction from obverse to reverse side of the drawing. The Hall element 42 is subjected to the magnetic field with the opposite direction. The direction of the control current flowing into the Hall element is opposite to that of FIG. 7.

Figure 9:
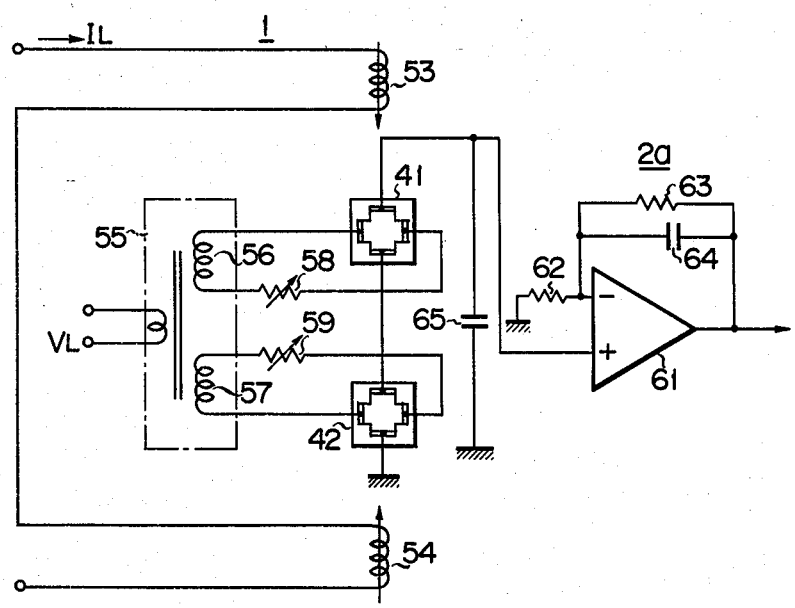
FIG. 9 is a circuit diagram showing still another embodiment of the invention.

The power-voltage converter 1 shown in FIG. 1 and the compensating amplifying circuit 2a as the differential amplifier circuit 2 are shown in detail in FIG. 9. One of the Hall output terminals of the Hall element 41 is connected to the same of the Hall element 42, in view of the polarities of the misalignment voltages of the respective elements 41 and 42. The electro-magnetic coils 53 and 54 to which the load current $I_L$ is fed develope bias magnetic fields onto the Hall elements 41 and 42, respectively.

The load voltage $V_L$ is applied to a transformer 55. High voltage of several hundreds volts is induced in each secondary winding 56 and 57 of the transformer. The induced high voltages are converted by variable resistors 58 and 59 into control current to be fed to Hall elements 51 and 52. Use of the high resistive resistors 58 and 59 enables constant control currents to be fed to the Hall elements 51 and 52, independently of the temperature variation of the Hall elements and the change of the internal resistance thereof.

When power is consumed in the load (not shown), the load current $I_L$ flows into the coils 53 and 54 which in turn develope magnetic fields corresponding to the load current $I_L$. These magnetic fields are applied as bias magnetic fields to the Hall elements 41 and 42. At this time, the control currents and the bias magnetic fields are applied to the Hall elements 41 and 42 with the relation of FIG. 7 or being suitable for this case. In this manner, the two Hall elements produce across the output terminals a Hall output voltage $V_H$ corresponding to instantaneous power, i.e. the product of the strength of the bias field and the control current, with offsetting of the misalignment voltages of the Hall elements. The instantaneous power P is given $$P = V_o I_o \cos \phi - V_o I_o \cos(2\omega t + \phi) \quad (4)$$

where voltage is 2 Vo sin $\omega t$ and current $\sqrt{2}$ Io sin ($\omega t + \phi$). In the equation (4), $V_o I_o \cos \phi$ is a DC component and an effective power.

The power-voltage converter I produces the Hall output voltage $V_H$ representing the instantaneous power P which in turn is fed to the non-inverted input terminal of the operational amplifier 61 of the compensating amplifier circuit 2a. The compensating amplifier circuit 2a comprises the operational amplifier 61, resistors 62 and 63, and capacitors 64 and 65. This circuit constitutes a sort of low-pass filter. The low-pass filter filters out the effective power corresponding to the DC component $V_o I_o \cos \phi$.

As described above, the input voltage is increased by the transformer and the increased voltage is applied to the high resistive resistor to be the constant control current. Coupling of two Hall elements stably produces the Hall output voltage substantially two times that of the case of a single Hall element. Further, the respective control current are controlled to substantially offset the misalignment voltages of the respective Hall elements. Therefore, a high accuracy of power measurement is ensured even in a light load region, i.e. of small input current.

Figure 10:
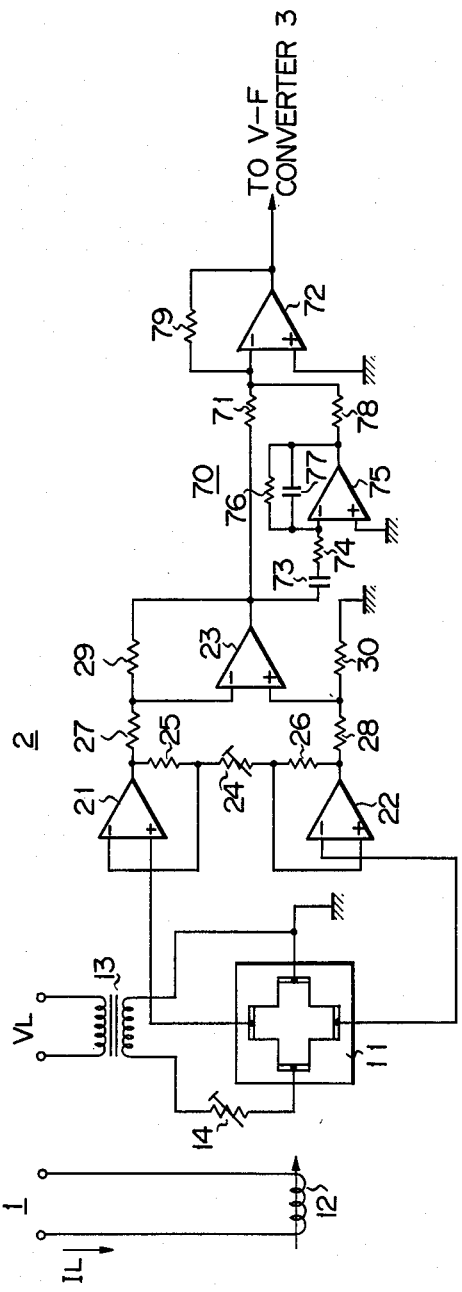
FIG. 10 is a circuit diagram showing a modification of the embodiment of FIG. 2.

Referring now to FIG. 10, there is shown another embodiment of the invention. In the circuit, the power-voltage converter 1 with the same construction as of FIG. 2 is coupled with a compensating circuit 70 through a differential amplifier circuit 2. The compensating circuit 70 operates to remove the AC component from the output voltage from the differential amplifier circuit 2 to take only the DC component therefrom. Both the DC and AC components from the operational amplifier 23 is supplied to the inverter input terminal of the operational amplifier 72, via a resistor 71. The AC component of the output signal of the operational amplifier 23 is fed to the inverted input terminal of the operational amplifier 75 via a resistor 74. Its non-inverted input terminal is connected to the ground. Parallel connected resistor 76 and capacitor 77 are inserted between the output terminal of the operational amplifier 75 and the inverted input terminal of it. The output terminal thereof is coupled with the inverted input terminal of the operational amplifier 72.

The output voltage of the differential amplifier circuit 2 includes DC component and AC component as well. The AC component included causes an error. To eliminate this, the phase and amplitude of the AC component taken out by the capacitor 73 is processed by the circuit including the operational amplifier 75. The output signal processed from the amplifier 75 is added to the voltage including AC and DC components transferred through the resistor 71, in anti-phase relation. As a result, only DC component is transferred to the V-F converter, through the operational amplifier 72 with a feedback resistor 79. This example handles a single phase AC power as its input signal; however, the same may be correspondingly applied to other multiphase AC power, as a matter of course.

Figure 11:
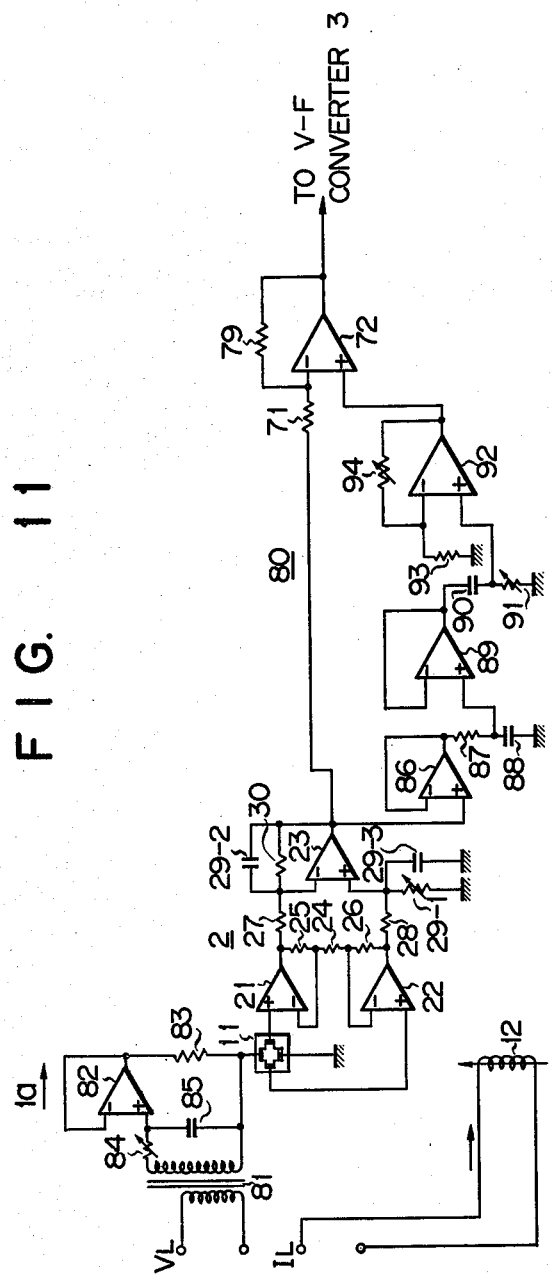
FIG. 11 is a circuit diagram showing another embodiment of the invention.

Still another embodiment shown in FIG. 11 has an operational amplifier as a constant current circuit and produces the product of the load current $I_L$ and the load voltage $V_L$. In this example, another compensating circuit is used to remove the AC component included in the output voltage of the differential amplifier circuit 2.

In FIG. 11, the bias magnetic field to be supplied to the Hall element 11 is developed by flowing the load current $I_L$ into the electromagnetic 12 associated with the Hall element 11. The control current to be supplied to the control current terminals of the Hall element 11 is obtained in a manner that the load voltage $V_L$ is reduced by the transformer 81 to be several volts and the reduced voltage is fed to a constant current source including an operational amplifier 82 and a resistor 83. At this time, the bias magnetic field developed from the electromagnet 12 is retarded in phase from the load current $I_L$. For this the load voltage $V_L$ is retarded in phase by a phase adjusting circuit including a variable resistor 84 and a load voltage $V_L$ thereby to eliminate the phase difference between the bias magnetic field and the control current.

When current flows into a load (not shown), the load current $I_L$ flows into the coil of the electro-magnet 12 to develope a magnetic field corresponding to the strength of the load current which in turn is applied as a bias magnetic field to the Hall element 11. The voltage proportional to the load voltage $V_L$ is obtained from the transformer 8 and causes the control current proportional to the load voltage $V_L$ to flow into the Hall element 11. As a result, the Hall element 11 produces across the Hall output terminals the product of the bias magnetic field and the bias current, i.e. the Hall output voltage $V_H$ proportional to the instantaneous power of the load.

As in the case of FIG. 2, the Hall output voltage $V_H$ is fed to the differential amplifier 2 comprised of three operational amplifiers 21, 22 and 23. As shown, the output terminals are connected to the noninverted input terminals of the operational amplifiers 21 and 22, respectively. The output terminals of the operational amplifiers 21 and 22 have a series circuit consisting of resistors 24, 25 and 26 therebetween. The inverted input terminal of the operational amplifier 21 is connected to the connection point of the resistors 24 and 25, and the inverted input terminal of the operational amplifier 22 to the connection point of the resistors 24 and 26. The output of the operational amplifier 21 is connected through a resistor 27 to the inverted input terminal of the operational amplifier 23. The output terminal of the operational amplifier 22 is connected through a resistor 28 to the non-inverted input terminal of the same. The non-inverted input terminal of the operational amplifier 23 is earthed through a parallel circuit including a variable resistor 29-1 and a capacitor 29-3 and the inverted input terminal is coupled with the output terminal of the operational amplifier 23 through a parallel circuit including a resistor 30 and a capacitor 29-2.

The differential amplifier circuit 2 also amplifies the misalignment voltage component to the Hall output voltage. To remove this, the in-phase voltage inputted is reduced so as to have a small magnitude; and the reduced voltage is adjusted by the variable resistor 29-1 to equal to the misalignment voltage in magnitude but opposite in phase. Through this process, the misalignment voltage of the Hall element 11 is completely eliminated.

The way to obtain only the DC component from the output voltage of the differential amplifier circuit 2 by means of the compensating circuit 80 will be described in detail. The voltage of the output terminal of the operational amplifier 86 is applied to the non-inverted input terminal of the operational amplifier 86 and at the same time to the inverted input terminal of the operational amplifier 72. The output voltage of the operational amplifier 86 is divided by a resistor 87 and a capacitor 88. The divided voltage is applied to the non-inverted input terminal of an operational amplifier 89. The output voltage of the operational amplifier 89 is divided by a capacitor 90 and a variable resistor 91 and the divided one is applied to the non-inverted input terminal of an operational amplifier 92. At this stage, the phase is advanced. At this time, through adjusting a variable resistor 91, the phases of the input voltages to the operational amplifier 86 and the operational amplifier 92 are placed in-phase. The voltage includes only AC component since DC component is removed by the capacitor 90. The AC component is adjusted of its manitude by a resistor 93 and the variable resistor 94 and then applied to the non-inverted input terminal of the operational amplifier 72. The output of the differential amplifier circuit 2 is inputted to the inverted input terminal of the operational amplifier 72. The AC components included in the input voltages at the non-inverted and the inverted input terminals of the amplifier 72 may be adjusted to be zero by adjusting the variable resistor 29-1, in the amplifier 72. As a result, the amplifier produces only DC component. Incidentally, capacitors 29-2 and 29-3 are used to control the gain of the amplifier with respect to the AC component included.

Figure 12:
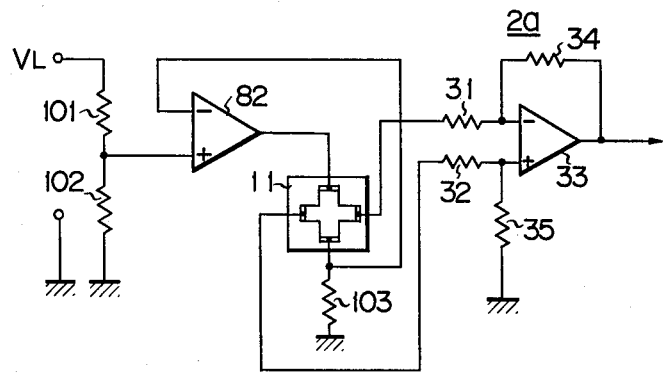
FIG. 12 is a circuit diagram showing yet another example of the power-voltage converter in FIG. 11.

In FIG. 11 embodiment, combination of the transformer 81 and the operational amplifier 82 is used for the circuit to stabilize the control current corresponding to the single phase AC load voltage $V_L$. The operational amplifier may be used for the DC load if a circuit construction shown in FIG. 12 is used. In FIG. 12, the DC load voltage $V_L$ is applied between the terminals of series connected resistors 101 and 102, as shown. The node between the resistors 101 and 102 is connected to the non-inverted input terminal of the operational amplifier 82 of which the output terminal is connected to one of the control current input terminals of the Hall element 11. The other control current input terminal is connected to the non-inverted input terminal of the amplifier 82 and also earthed via a resistor 103. The Hall output terminals are coupled with the input terminals of an operational amplifier 33, by way of resistors 31 and 32 of the amplifier circuit 2a constructed as in the FIG. 3 circuit.

Figure 13:
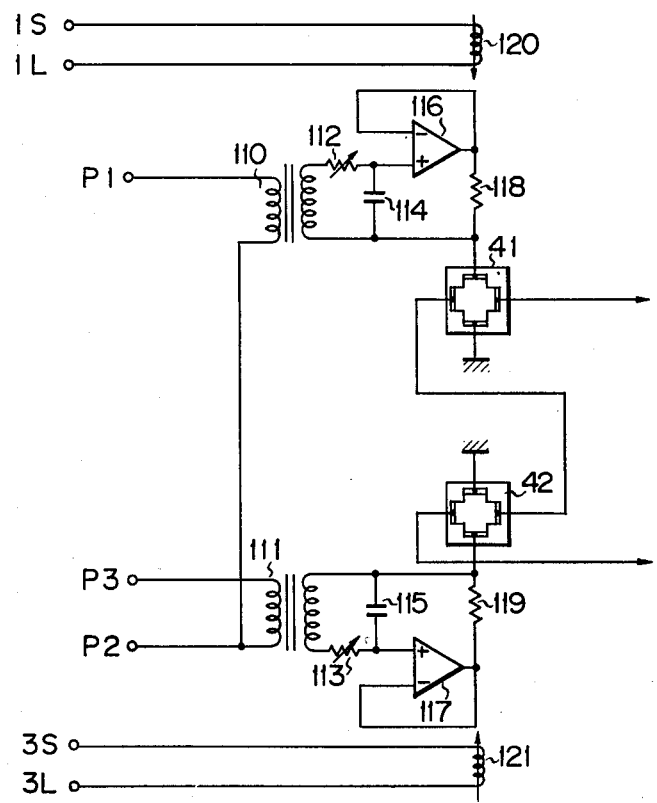
FIG. 13 is a circuit diagram when the principle of the FIG. 12 embodiment is applied to a three-phase watt-hour meter.

Referring now to FIG. 13, there is shown an example of circuits to measure three-phase AC power. In the figure, the interphase voltage between $P_1$ and $P_2$ phases is applied to a transformer 110. The transformed voltage is stabilized through a circuit including a capacitor 114, a resistor 112 and an operational amplifier 116 into a constant control current to be fed to the Hall element 41. Similarly, the interphase voltage between $P_3$ and $P_2$ phases is applied through a transformer 111 to a circuit including a resistor 113, a capacitor 115 and an operational amplifier 117. The circuit feeds a constant control current to the Hall element 42. The current between terminals 1S and 1L is fed to an electromagnet coil 120 to develope the bias magnetic field. Likewise, the current between 3S and 3L is fed to another electromagnet coil 121 to develope the bias magnetic field. The Hall output voltage produced from the series connected Hall elements is entered into the differential amplifier circuit 2 and the compensating circuit 80 to provide an output voltage corresponding to the effective three-phase power to be measured.

What we claim is:
1. A multiplier using a Hall element comprising:
    at least one Hall element having a pair of control current input terminals and a pair of Hall output voltage terminals;
    at least one electromagnet means for converting load current into magnetic field and applying the magnetic field to said Hall element;
    means for converting load voltage into constant control current and then for feeding the constant control current to said control current input terminals;
    said Hall element producing across the Hall output terminals Hall output voltage corresponding to the product of the load current and the load voltage;
    wherein said control current supplying means includes a transformer with primary winding and with secondary winding for boosting single phase AC load voltage, and at least one high resistive means coupled with the secondary winding, and means for feeding the current fed through said high resistive means to the control current terminals of said Hall element.

2. A multiplier according to claim 1, in which said high resistive means is a variable resistor.

3. A multiplier according to claim 1, in which said control current supplying means including terminals for receiving single-phase AC load voltage, and said at least one high resistive means is coupled between said terminals and the control current input terminals of said Hall element.

4. A multiplier using a Hall element comprising:
    at least one Hall element having a pair of control current input terminals and a pair of Hall output voltage terminals;
    at least one electromagnet means for converting load current into magnetic field and applying the magnetic field to said Hall element;
    means for converting load voltage into constant control current and then for feeding the constant control current to said control current input terminals;
    said Hall element producing across the Hall output terminals Hall output voltage corresponding to the product of the load current and the load voltage;

wherein said multiplier including first and second Hall elements of which Hall output terminals are connected in series, said electromagnet means includes first and second electromagnets for applying magnetic fields to said first and second Hall elements, and said control current supplying means includes a boosting transformer with primary winding for receiving single-phase AC load voltage and with first and second windings, first and second variable resistors connected with said first and second secondary windings, respectively, and means for feeding control currents fed from said first and second variable resistors to the control current input terminals of first and second Hall elements, respectively.

5. A multiplier using a Hall element comprising:
at least one Hall element having a pair of control current input terminals and a pair of Hall output voltage terminals;
at least one electromagnet means for converting load current into magnetic field and applying the magnetic field to said Hall element;
means for converting load voltage into constant control current and then for feeding the constant control current to said control current input terminals;
said Hall element producing across the Hall output terminals Hall output voltage corresponding to the product of the load current and the load voltage;
wherein said multiplier including first and second Hall elements of which the Hall output terminals are connected in series, said electromagnet means including first and second electromagnet means for applying magnet fields corresponding to current between two phases of three phases to said first and second Hall elements, and said control current supplying means including first and second boost transformer with primary windings for receiving the interphase voltages between two phases of three-phase voltage and secondary windings connected to the control current input terminals of said first and second Hall elements, and at least one variable resistor connected to the secondary winding of each of said first and second Hall element.

6. A multiplier using a Hall element comprising:
at least one Hall element having a pair of control current input terminals and a pair of Hall output voltage terminals;
at least one electromagnet means for converting load current into magnetic field and applying the magnetic field to said Hall element;
means for converting load voltage into constant control current and then for feeding the constant control current to said control current input terminals;
said Hall element producing across the Hall output terminals Hall output voltage corresponding to the product of the load current and the load voltage;
wherein said control current supplying means comprises:
a transformer with primary and secondary windings for reducing single-phase AC load voltage;
a variable resistor connected at one end to one end of the secondary winding of said transformer, an operational amplifier with the non-inverted input terminal connected to the other end of said variable resistor, the output terminal and the inverted input terminal connected to the output terminal;
a resistor connected between the output terminal and the other end of the secondary winding;
a capacitor connected between the non-inverted input terminal of said operational amplifier and the other end of the secondary winding; and
means for coupling the node between the resistor and the other end of the secondary winding to one of said control current input terminals of said Hall element.

7. A multiplier using a Hall element comprising:
at least one Hall element having a pair of control current input terminals and a pair of Hall output voltage terminals;
at least one electromagnet means for converting load current into magnetic field and applying the magnetic field to said Hall element;
means for converting load voltage into constant control current and then for feeding the constant control current to said control current input terminals;
said Hall element producing across the Hall output terminals Hall output voltage corresponding to the product of the load current and the load voltage;
wherein said control current supplying means comprises:
load voltage supplying terminals, first and second resistors being connected in series between said terminal and the ground, an operational amplifier with the non-inverted input terminal connected to the node between said first and second resistors, the inverted input terminal connected to one of said control current input terminals of said Hall element and the output terminal connected to the other of said control current input terminal, and a third resistor connected between one of said control current input terminals and the ground.

8. A multiplier using a Hall element comprising:
at least one Hall element having a pair of control current input terminals and a pair of Hall output voltage terminals;
at least one electromagnet means for converting load current into magnetic field and applying the magnetic field to said Hall element;
means for converting load voltage into constant control current and then for feeding the constant control current to said control current input terminals;
said Hall element producing across the Hall output terminals Hall output voltage corresponding to the product of the load current and the load voltage;
wherein said multiplier includes first and second Hall elements of which the output terminals are connected in series, said electromagnet means includes first and second electromagnets for applying magnetic fields corresponding to currents flowing between two phases of three-phases to said first and second Hall elements, said control current supplying means includes first and second transformers each with primary winding for receiving the interphase voltage between two phases of the three-phases and secondary winding, first and second resistors each connected to one end of each of the secondary winding of each of said first and second transformer, first and second operational amplifiers with non-inverted input terminals connected to the other ends of said first and second variable resistors, output terminals and inverted input terminals connected to the output terminals, first and second resistors for coupling the outputs of said first and second operational amplifiers with one input terminals of said control current input terminals of said first and second Hall elements, and first and second capacitors between the one terminals of said control current input terminals and the non-inverted input terminals of said first and second operational amplifiers.

9. A multiplier according to claim 1, further comprising a differential amplifier circuit for removing the in-phase component of the Hall output voltage obtained from said Hall element and then for amplifying it.

10. A multiplier according to claim 9, further comprising a compensating circuit for removing AC component from the output signal of said differential amplifier to take only DC component therefrom.

* * * * *